United States Patent [19]

Cain

[11] Patent Number: 5,343,033
[45] Date of Patent: Aug. 30, 1994

[54] METHOD AND APPARATUS FOR DETECTING LASER LIGHT HAVING A PLURALITY OF PULSE INTEGRATOR AND AUTOMATIC GAIN CONTROL CIRCUITS

[75] Inventor: Gary L. Cain, Springfield, Ohio

[73] Assignee: Apache Technology Inc., Dayton, Ohio

[21] Appl. No.: 81,404

[22] Filed: Jun. 22, 1993

[51] Int. Cl.$^5$ ............................................. H01J 40/14
[52] U.S. Cl. .......................... 250/208.2; 250/214 AG; 307/311
[58] Field of Search ................. 250/214 AG, 214 LA, 250/214 A, 214 RC, 208.2, 561; 356/141, 152; 307/311, 261

[56] References Cited

U.S. PATENT DOCUMENTS

3,812,386 5/1974 Porter ................................. 307/261
4,851,660 7/1989 Juds et al. ...................... 250/214 A
4,884,939 12/1989 Nielsen .

*Primary Examiner*—David C. Nelms
*Attorney, Agent, or Firm*—Frost & Jacobs

[57] ABSTRACT

A laser light detector is provided which can be used to detect pulsed laser light that is produced by a rotating laser light source on a construction job site. The laser light detector provides an easily-read display which is indicative of the present level or elevation of the laser light detector with respect to the plane of rotating laser light. The laser light detector has a very large dynamic range, while maintaining a very good signal-to-noise ratio, and can, therefore, be used at both short and long distances from the rotating laser light source. The laser light detector is not dependent upon the energy level received of laser light, or by the spot size of laser light as it reaches the light detectors. Multiple discrete steps of elevation indication are provided, which can easily be increased to a larger number of discrete steps, if so desired. The laser light detector is available with several options, including dead band adjustment, normal or offset on-grade displaying, and averaging.

22 Claims, 6 Drawing Sheets

METHOD AND APPARATUS FOR DETECTING LASER LIGHT HAVING A PLURALITY OF PULSE INTEGRATOR AND AUTOMATIC GAIN CONTROL CIRCUITS

TECHNICAL FIELD

The present invention relates generally to light sensing equipment and is particularly directed to detecting pulsed laser light of the type which is used on construction sites to detect the equipment elevation with respect to a plane of laser light created by a rotating laser source. The invention will be specifically disclosed as an elevation detector which provides an equipment operator with the current elevation status, as being, for example, too "high," "on grade," or too "low" with respect to the plane of laser light.

BACKGROUND OF THE INVENTION

Laser light detectors have been available in the past for use in precisely determining the proper elevation on construction job sites. The standard method for using such detectors is to mount a rotating laser light source at a particular elevation on a construction job site, then mount the laser light detector on a piece of equipment (such as on the blade of a bulldozer) to let the operator of the equipment know precisely the elevation of the equipment while the it is in use. For example, the laser light detector could be mounted on a pole attached to the blade of a bulldozer, so the operator of the bulldozer could keep the blade at the correct position while grading the land to the precise elevation desired.

To be most effective, a laser light detector would have an easily viewable display that gives the elevation indication to a person who is sited a few feet from the detector. In addition, the detector would normally have some type of photodiode or other photo-detecting devices on all four corners of the detector's enclosure, so that it could detect laser light coming from any direction. Typical laser light detectors must operate within a one hundred millisecond cycle time, since most rotating laser light sources rotate at 600 rpm.

Typical laser sources used as rotating laser light sources operate in either the infrared or red light frequency spectrum. For example, infrared laser diodes operating at 780 nm are commonly used, as well as red light helium-neon gas lasers, operating at 633 nm. The laser light is typically collimated. Various rotating laser light sources are available having beam sizes from as small as one-quarter inch in diameter to as large as three-quarter inches in diameter.

Laser light detectors are typically available in two types of models: a "machine control receiver" and a "hand-held receiver". The machine control receiver is typically mounted on a piece of equipment, such as a bulldozer, and used in the manner discussed above. The hand-held receiver is typically a smaller device which can be carried by a typical construction worker to be used to detect the elevation of locations at a moment's notice.

A typical machine control receiver would use four light-sensitive arrays (one per side of the detector's enclosure), each having eight photodiodes arranged in a vertical linear manner. The eight photodiodes are typically arranged in pairs, thereby producing four channels of light input information. Each of the pairs of photodiodes are connected in parallel and drive a pulse amplifier, thereby converting the current pulse, generated as laser light sweeps across and is received by the photodiodes, into a voltage pulse. Since there are four channels of photodiodes, there would also be four channels of pulse amplifiers.

The voltage output of each pulse amplifier is directed into a comparator circuit, in which the peak value of the voltage pulse received from the pulse amplifier is compared to a voltage reference that is predetermined in the machine control receiver. If the received voltage pulse is of sufficient amplitude, the output of the comparator will change state and produce a logic pulse, e.g., by driving the input of a one-shot circuit (i.e., a monostable multivibrator circuit), which will have an output that changes state and holds that state for a time. Again, since there are four input channels, there would be four comparators and four latching circuits (such as one-shot circuits), one per input channel.

In the typical machine control receiver, the output of each of the four latching circuits is directed into a decoder circuit, which then determines the elevation that should be displayed by the machine control receiver. Once this decoding function has taken place, the latching circuits are all reset back to their initial zero output states. The decoder circuit uses a truth table to determine what the display should be showing. For example, if the photodiodes are arranged such that input channel number 1 is connected to the physically highest pair of photodiodes, then input channel 2 would be connected to the pair of photodiodes positioned just below, input channel 3 would be the next pair below that, and input channel 4 would be connected to the lowest pair of photodiodes. It is desirable that the positions of the photodiodes are arranged such that the diameter of the beam, as it strikes the photodiode array, will strike either one photodiode alone, or a pair of adjacent photodiodes. In other words, the photodiodes are arranged such that the light beam should not strike more than two photodiodes of the array at one time, however, some rotating light sources use wider beam widths which may cover more than two adjacent photodiodes.

Using the information gleaned from these four input channels, the decoder circuit of the machine control receiver can determine at least seven elevations of beam strike height, as follows: if input channel 4 alone receives a light pulse, then the "course high" indication is displayed; if both channels 3 and 4 are detecting light, then the "medium high" indication is displayed; if channel 3 alone receives a light pulse then the "fine high" indication is displayed; if both input channels 2 and 3 are receiving light (meaning that the light beam is striking the very center of the photodiode array), then the "on-grade" indication is displayed; if input channel 2 alone is receiving light, then the "fine low" indication is displayed; if both input channels 1 and 2 are receiving light, then the "medium low" indication is displayed, and finally; if channel 1 alone is receiving light then the "course low" indication is displayed. Naturally, if none of the input channels are receiving light, then the display would give no indication of elevation.

Using the above scheme of light detection, only seven discrete elevations of indication are possible. In addition, since the magnitude of the received light pulse, as its voltage equivalent is output from the pulse amplifier, is compared to a fixed voltage reference by the comparator, the machine control receiver of the prior art is greatly influenced by the energy level of the received light. Typical prior art rotating light sources can emit either infrared, or red light, as related hereinabove, and such infrared sources produce less power than the red light sources. This means that the machine control receiver will operate with different characteristics when used with an infrared source than when used with a red light source.

Another problem in using a machine control receiver of the prior art is the use of rotating light sources that have different spot sizes. Since the decoder depends upon the received light beams striking either one or two adjacent photodiodes at a particular time, the machine control receiver will exhibit different characteristics if the beam size changes from one rotating laser light source to another. In other words, it will be more difficult for two photodiodes to simultaneously receive a light pulse when the laser light source is outputting a very narrow beam width.

The other type of prior art laser light detector, the hand-held receiver, typically uses two photodiodes arranged one above the other along a vertical line, or uses a split single photodiode which produces two outputs. A typical laser light detector of this design is described in U.S. Pat. No. 4,676,634. The photodiode converts light energy into a current which is directed into the input of a pulse amplifier, which then converts the current into a voltage pulse. Since there are two current inputs, there are also two pulse amplifiers. The voltage output of each pulse amplifier is directed into a peak detector, which temporarily stores the peak magnitude of the voltage pulse that is output from each of the pulse amplifiers.

The output of the peak detector from the upper photodiode can be given the designation "A", and the output of the peak detector from the lower photodiode can be given the designation "B" Signals A and B are directed into a ratio comparator circuit which has four logic outputs. The first logic output will be activated if $A > K_1 B$. The second logic output would be activated if $A > K_2 B$. The third logic output would be activated if $B > K_1 A$, and the fourth logic output would be activated if $B > K_2 A$. Constants $K_1$ and $K_2$ are determined in advance by the hand-held receiver as fixed values. It can thus be seen that the logic output states are determined by the comparison of the intensity of signal A versus the intensity of signal B, to produce the desired logic output states. These four logic signals are directed into a decoder and latching circuit, which determines what elevation should be indicated on the visual display of the hand-held receiver.

The primary problem with such peak detecting units is the fact that their signal-to-noise ratio is poor. As system noise increases, the signal-to-noise ratio decreases. In fact, if the noise increases substantially to the point where it swamps out the signal, then the signal-to-noise ratio becomes nearly equal to 1.0 or less than 1.0, which is an extremely poor signal-to-noise ratio.

As related hereinabove, the laser light detectors presently available are either not reliable when the signal magnitude is diminished (by weather effects, for example) causing a poor signal-to-noise ratio (in the hand-held receiver, for example), or are greatly influenced by either the energy level received, or by a varying beam size of the light pulse striking the detector (in the case of the machine control receiver).

SUMMARY OF THE INVENTION

Accordingly, it is a primary object of the present invention to provide a laser light detector that overcomes the prior art problems of poor signal-to-noise ratio and performance variations due to dependence upon the energy level received, or due to varying beam size of a rotating laser light source.

It is another object of the present invention to provide a laser light detector which has a very high dynamic range so that it can reliably indicate the proper elevation while located throughout various distances from the rotating laser light source while accommodating variations in spot size, wavelength, output power, and energy distribution of the rotating laser light source.

It is a further object of the present invention to provide a laser light detector which can provide a multiple number of discrete steps of elevation indication based upon a numeric value of position which is calculated from the light intensity received by each of the light-sensitive detectors of its light-sensing arrays.

Additional objects, advantages and other novel features of the invention will be set forth in part in the description that follows and in part will become apparent to those skilled in the art upon examination of the following or may be learned with the practice of the invention.

To achieve the foregoing and other objects, and in accordance with one aspect of the present invention, an improved laser light detector is provided having a very good signal-to-noise ratio which allows for stable and more accurate operation by use of an integrator circuit which reduces the average noise signal to a zero, or near-zero, value. The fact that the integrator circuit is employed in the improved laser light detection dictates a circuit which has a very large dynamic range to allow its use at various distances from a rotating laser light source. The large dynamic range is accomplished by integrating the peak power of each received light pulse, after it has been converted into a voltage magnitude thereby determining the total energy of the light pulse, and by using an automatic gain control circuit to allow the laser light detector to operate with either very short light pulse widths (when the detector is located at large distances from the rotating laser light source), or with very long light pulse widths (for when the detector is positioned very close to the laser light source). A microprocessor is provided to control the automatic gain control circuit to ensure that the signal values derived from the integrator circuit are always in a useful dynamic range of signal strength (and not saturated) under all operating conditions.

A plurality of input channels is provided in which each input channel derives its signal from one or more photodiodes, or other light detectors, arranged in vertical banks or arrays of such detectors. Each input channel is directed through a pulse amplifier, and integrator and automatic gain control circuitry, thereby providing a plurality of signals which are in a useful voltage range, which are then directed into an analog-to-digital converter that multiplexes through these signals providing a numeric data output indicative of the total energy of the light striking each of the input channels' light detectors. These numeric values are stored in memory under control of the microprocessor, and a calculation is performed by the microprocessor to derive another numeric value indicative of the position which corresponds to the rotating plane of laser light being received by the detector arrays of the laser light detector. Before making the elevation calculation, the quiescent circuit operating conditions are subtracted from each of the input channels numeric values, thereby compensating for any changes in those quiescent conditions. After the numeric value of elevation position has been determined, it is compared to predetermined discrete thresholds to find the exact elevation to be indicated on a display. The display will typically indicate the elevation as "on-grade", or too high in various degrees, or too low, again in various degrees.

The laser light detector is equipped with several options, such as a "dead band" width (or accuracy) selection, and a "normal" on-grade, or "offset" on-grade choice, which determines the center line of the display for the "on-grade" indication. In addition, an "averaging" option can be selected for use when the laser light detector is located at a large distance from the rotating laser light source, which will somewhat compensate for the plane of laser light bouncing up and down due to atmospheric affects. Other options can be easily implemented, including the provision of a larger number of discrete "high" or "low" steps that can be displayed, simply by altering the value and numbers of discrete thresholds that the numeric value of the elevation indication is compared to. Since the elevation indication is in a numeric form, the number of discrete steps to be indicated is simply restricted by the number of different elevations that are desired to be provided on the display. A larger display could quite easily display a much larger number of elevations, if so desired.

Still other objects of the present invention will become apparent to those skilled in this art from the following description and drawings wherein there is described and shown a preferred embodiment of this invention in one of the best modes contemplated for carrying out the invention. As will be realized, the invention is capable of other different embodiments, and its several details are capable of modification in various, obvious aspects all without departing from the invention. Accordingly, the drawings and descriptions will be regarded as illustrative in nature and not as restrictive.

BRIEF DESCRIPTION OF THE DRAWINGS

The accompanying drawings incorporated in and forming a part of the specification illustrate several aspects of the present invention, and together with the description and claims serve to explain the principles of the invention. In the drawings:

DETAILED DESCRIPTION OF THE INVENTION

Reference will now be made in detail to the present preferred embodiment of the invention, an example of which is illustrated in the accompanying drawings, wherein like numerals indicate the same elements throughout the views.

Figure 1:
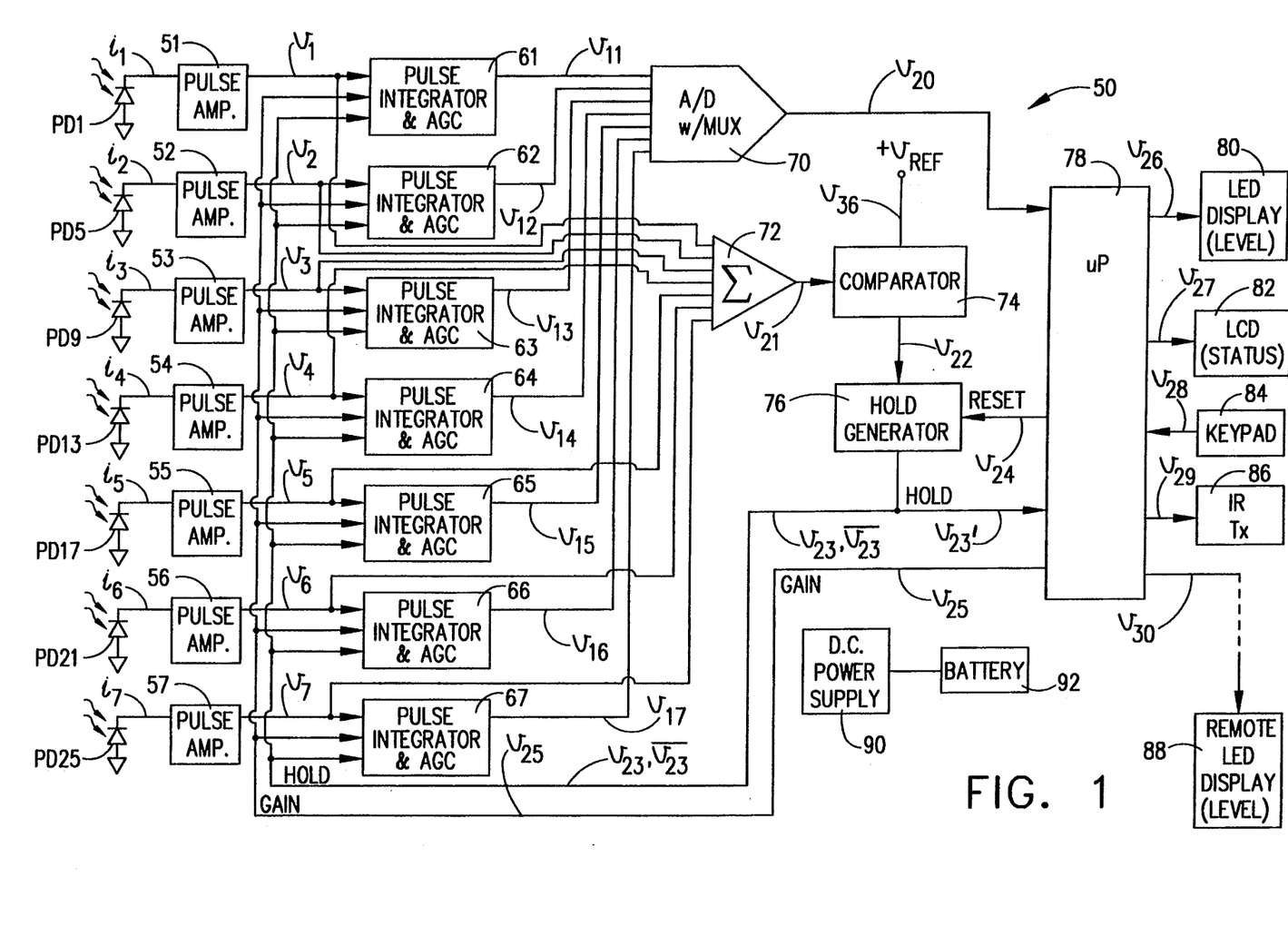
FIG. 1 is a block diagram of a laser light detector constructed in accordance with the principles of the present invention.

Referring now to the drawings, FIG. 1 depicts a block diagram of the entire laser light detector 50 of the present invention, having multiple inputs and at least two display outputs driving an elevation (or grade) display and a status display. In the illustrated embodiment of FIG. 1, there are seven channels of inputs, each having at least one photodiode, pulse amplifier, pulse integrator, and automatic gain control (AGC) circuit. Following the circuit of input channel 1, for example, a photodiode PD1 produces an AC component of a current $i_1$ when laser light having a proper wavelength strikes photodiode PD1. The current $i_1$ is converted into a voltage $v_1$ by pulse amplifier 51, after which $v_1$ is integrated by pulse integrator and automatic gain control circuit 61. An analog voltage level $v_{11}$ is produced by the output of the integrator, having a voltage level which is proportional both to the intensity of the light that struck photodiode PD1 and to the time duration during which the light was striking that photodiode.

Figure 6:
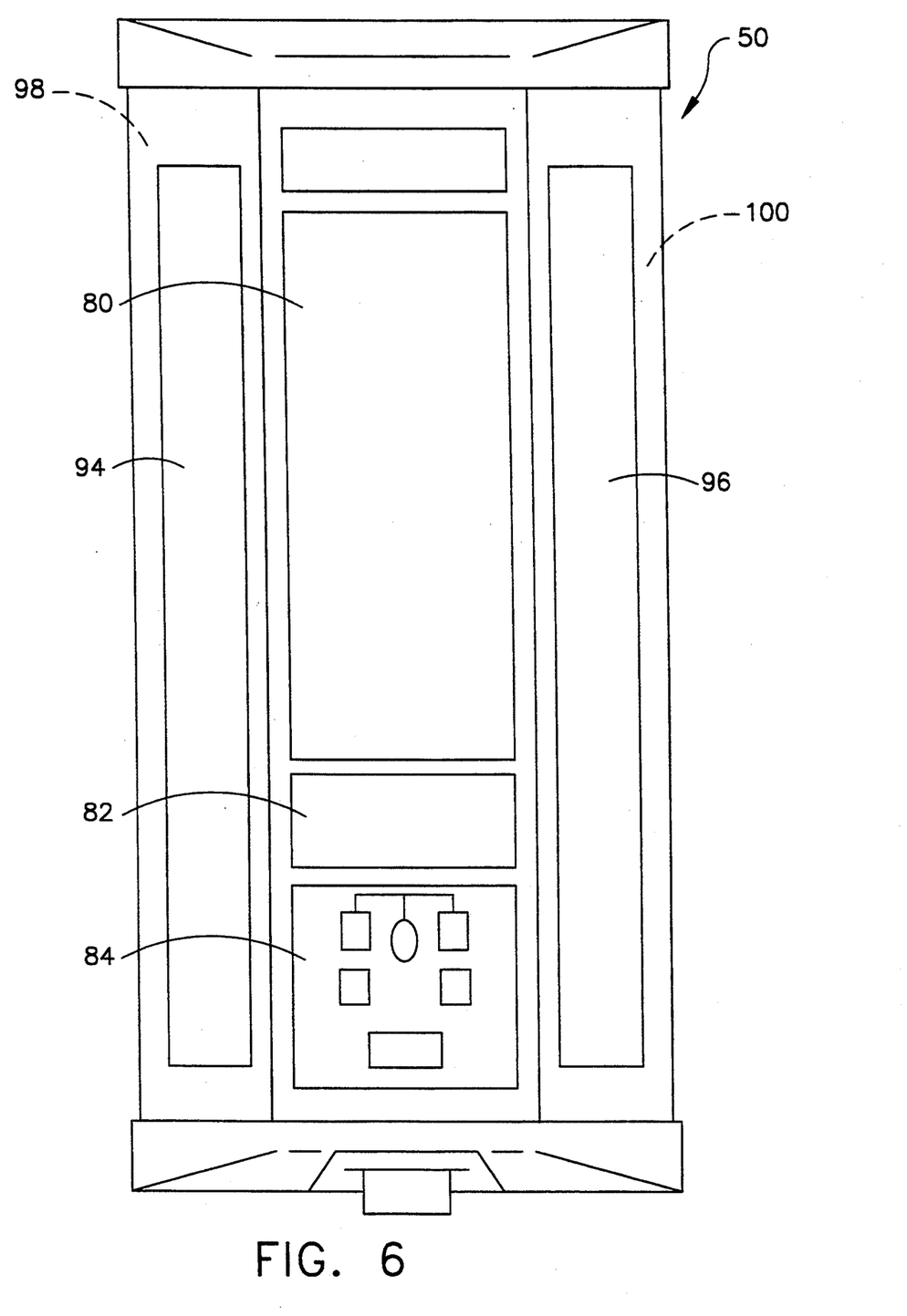
FIG. 6 is an elevational front view of the laser light detector of FIG. 1.

The physical layout of a preferred embodiment of laser light detector 50 is depicted in FIG. 6. In the illustrated embodiment of FIG. 6, there are four photodiode arrays designated by the index numerals 94, 96, 98, and 100. Each of these photodiode arrays comprises several photodiodes, such as PD1, linearly arranged in a vertical manner so as to detect light striking any one of the photodiode arrays at various elevations along such arrays. It will be understood that a non-linear arrangement of photodiodes could be constructed for photodiode arrays 94, 96, 98, and 100 without departing from the principles of the present invention.

A typical application using laser light detector 50 is to detect laser light that is generated by a rotating laser (not shown) which is located on a construction jobsite at a particular elevation. A plane of rotating laser light is generated by this rotating laser, and a laser light detector 50 located within that plane of laser light will be able to detect the laser light when such light strikes any of its photodiode arrays 94, 96, 98, or 100. The laser light detector 50 is normally attached to a particular piece of construction equipment, such as a bulldozer, so that its movements can be gauged against the plane of laser light, thereby enabling the elevation of the bulldozer to be controlled throughout its path along the construction job site.

The plane of rotating laser light is often horizontal, however, in some applications a sloping, non-horizontal plane of light may be desirable. In other applications, a vertical plumb plane may be desired. It will be understood that such varying applications are common to persons skilled in the appropriate art.

Laser light detector 50 is normally mounted on a piece of equipment in a manner that the equipment's operator can see the LED (light emitting diode) display 80 giving the operator a visual indication of the present elevation. LED display 80 comprises visual indicators which easily tell the operator whether laser light detector 50 is "on grade" Oust at the correct elevation), too high, or too low. In addition, several graduations of high or low elevations can be indicated on LED display 80, so that the equipment operator can adjust his usage of the equipment accordingly. For example, if laser light detector 50 is located at the correct elevation (i.e., is on grade), then LED display 80 will preferably show the indication, "--".

On the other hand, if the vertical position of laser light detector 50 is just a little too low, then a horizontal pair of dots will light on LED display 80 just below the location of the "on grade" indicator, thereby telling the operator that he needs to raise his equipment just a little. In this state, LED display 80 is indicating a "fine low" indication. If the laser light detector 50 is positioned a little farther too low, then two rows of horizontal dots are lighted on LED display 80, indicating a "medium low" condition. If laser light detector 50 is located even lower compared to the rotating plane of laser light, then LED display 80 will show three horizontal rows of dots, thereby telling the operator that the equipment is in a "course low" condition. If laser light detector 50 is positioned even lower then the "course low" position such that it no longer is within the rotating plane of laser light, then LED display 80 will not provide any elevation information.

The reverse is true for a high condition, in that the dots that appear in a high condition are located above the "on grade" indicator on LED display 80. Using a "normal" set of control parameters, LED display 80 can indicate a "fine high", "medium high", or "course high" condition. As will be disclosed hereinbelow, the number of elevations of high or low conditions is only limited in laser light detector 50 of the present invention by the number of various elevations that is deemed useful to the operator of the equipment. In other words, rather than having only three elevations of high and three elevations of low conditions, laser light detector 50 could easily display 5 or 6 elevations of high and 5 or 6 elevations of low conditions.

Laser light detector 50 also has a liquid crystal display 82 which indicates the various optional settings chosen by the set-up operator of the equipment. Liquid crystal display 82 also indicates the battery condition, if a battery is used, and whether the touch panel (keypad 84) is in a "locked" or "unlocked" position. Keypad 84 is used to select the various optional settings available in laser light detector 50, which will be discussed in detail hereinbelow.

The individual photodiodes of each of the photodiode arrays 94, 96, 98, or 100 are arranged such that light at a certain elevation will strike at least one of the corresponding photodiodes for any one of these arrays, thereby producing a proper elevation indication within laser light detector 50. In other words, if the rotating laser light is striking the very top-most diode of photodiode array 94, then if the equipment that laser light detector 50 was mounted on was turned so that a different photodiode array was aimed toward the rotating laser light source, then its top-most photodiode would be receiving that same plane of laser light. As depicted on FIG. 2, each of the individual photodiodes, for example PD1, PD2, PD3, and PD4, of the four photodiode arrays 94, 96, 98, and 100, are connected in parallel so that a current $i_1$ will be produced when laser light strikes any one of these four photodiodes.

Figure 2:
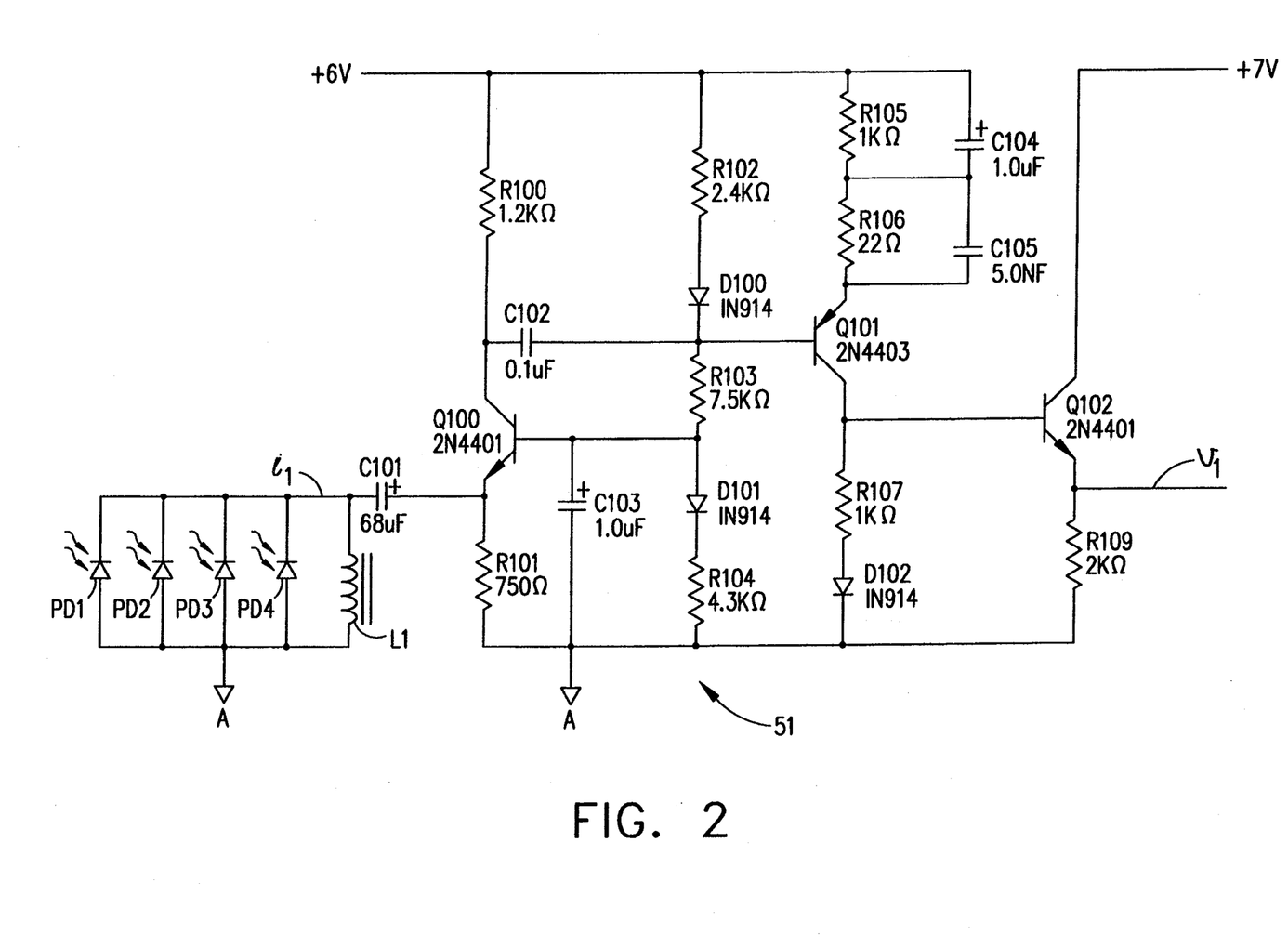
FIG. 2 is a schematic diagram of the light sensors and pulse amplifier of each input channel of the laser light detector of FIG. 1.

Concentrating on input channel 1, which is depicted in FIG. 2, the inductor L1 shunts out any direct current which is produced by sunlight in any of photodiodes PD1, PD2, PD3, or PD4. In addition, $i_1$ is capacitively coupled by C101, such that only the AC component of $i_1$ is received at the emitter of transistor Q100. As the rotating laser light strikes one of these photodiodes of channel 1, a short pulse of current $i_1$ flows from the emitter of transistor Q100 through capacitor C101 into the given photodiode that is detecting the light.

Pulse amplifier 51, also depicted in FIG. 2, is designed to amplify this current pulse $i_1$ and convert it into a corresponding positive-going voltage pulse $v_1$ at the emitter of Q102. The preferred pulse amplifier circuit is given in FIG. 2, including all component values of the various electrical components, and including the preferred DC voltage supply levels (6 volts and 7 volts DC) on the input and output of the pulse amplifier circuit, respectively. It will be understood that other circuit configurations, or other component values or power supply levels could be used without departing from the principles of the present invention. Laser light detector 50 has two different common points, an analog common "A" and a digital common "D", which are commonly connected but have separate common planes. As can be seen in FIG. 2, the pulse amplifier 51 is connected to analog common A.

Referring again to FIG. 1, laser light detector 50 may have several input channels of photodiode detectors, in which eight photodiodes per photodiode array can be, for example, combined into four channels of inputs, each having a pulse amplifier and pulse integrator circuit. Greater precision can be achieved, for example, by using ten photodiodes per photodiode array, which can be connected into seven channels of inputs, each having a pulse amplifier and a pulse integrator. The number of photodiodes per photodiode array and the number of input channels are strictly up to the designer of the overall circuit of laser light detector 50, and it will be understood that the overall principles of operation of laser light detector 50 are not affected by the quantity of input channels.

As can be seen on FIG. 1, photodiode PD5 produces a current $i_2$ as an input to pulse amplifier 52, which then produces a voltage output $v_2$. Voltage pulse $v_2$ continues into pulse integrator and automatic gain control circuit 62, which then outputs a voltage level $v_{12}$. Input channel 3 has corresponding components PD9, $i_3$, pulse amplifier 53, $v_3$, pulse integrator and automatic gain control circuit 63, and $v_{13}$. In the illustrated embodiment of FIG. 1, laser light detector 50 continues on to a seventh input channel having a photodiode PD25 producing current $i_7$, a pulse amplifier 57 producing a voltage pulse $v_7$, a pulse integrator and automatic gain control circuit 67, finally producing a voltage $v_{17}$.

Each of the DC voltage levels $v_{11}$ through $v_{17}$ are individually connected to an analog-to-digital (A/D) converter 70, which has a multiplexed input. The output of A/D converter 70 is a voltage $v_{20}$ which is directed into an input of microprocessor 78. In the illustrated embodiment of FIG. 1, $v_{20}$ is a serial data signal which is communicated to a serial data port of microprocessor 78. A/D converter 70 is preferably an integrated circuit manufactured by Texas Instruments, located in Dallas, Tex., and having a part number TLC1541. The preferred microprocessor 78 is manufactured by Motorola Corporation located in Phoenix, Ariz., and under the part number 68HC705C8, and is, in fact, a microcontroller having on-board RAM (random access memory), ROM (read only memory), and several serial and parallel input/output ports which are used to communicate to various address, data, and control lines.

The multiplexer portion of A/D converter 70 can select each of the seven input channels depicted in FIG. 1 and convert the input analog voltage into a digital number. The decision as to which channel is selected is controlled by microprocessor 78, using address and data lines which are not shown on FIG. 1. Using this control scheme, microprocessor 78 can determine the voltage level of signals $v_{11}$ through $v_{17}$ at any time desired by the predetermined computer program executing within microprocessor 78.

Figure 4:
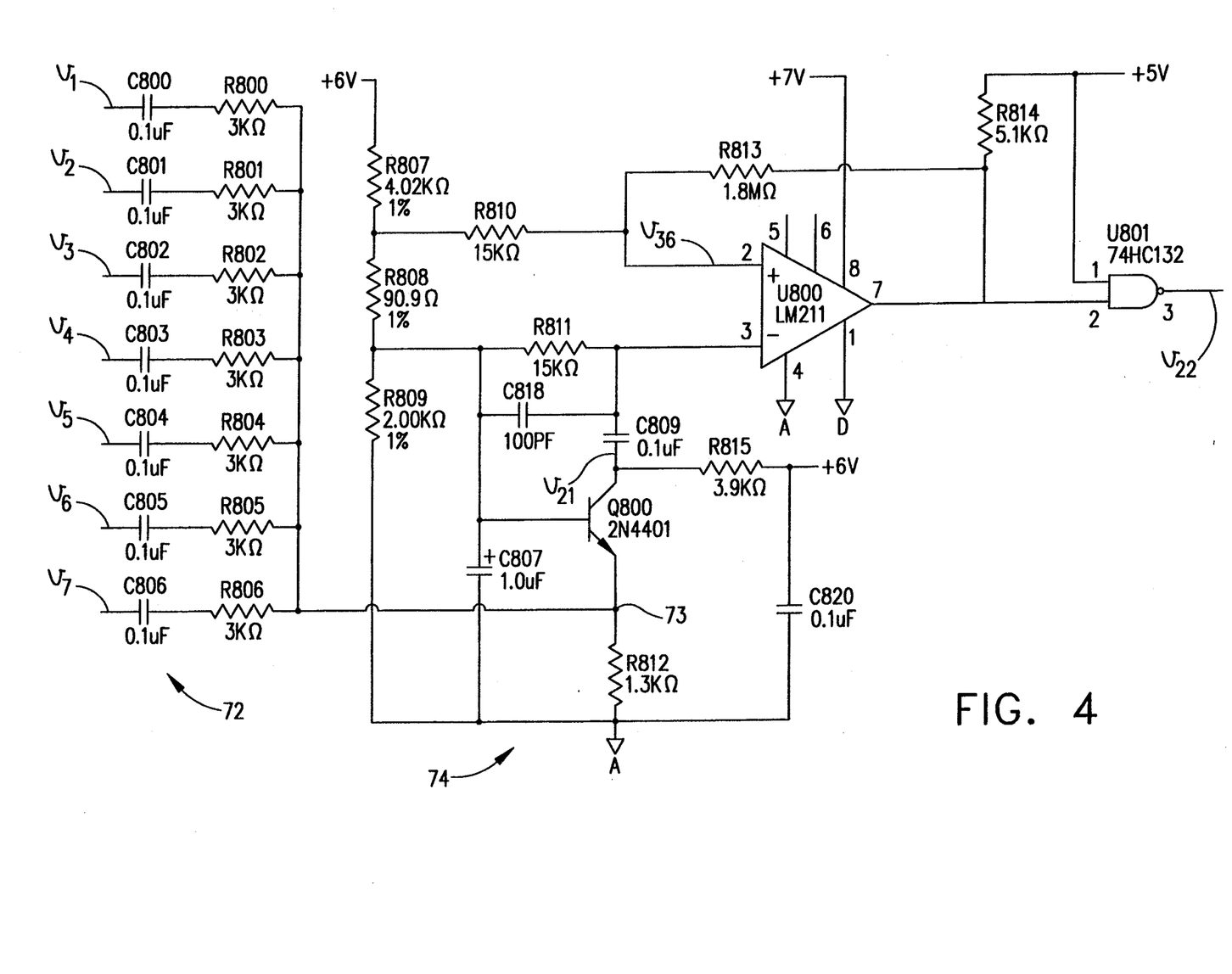
FIG. 4 is a schematic diagram of the voltage summing amplifier and voltage comparator circuit used in the laser light detector of FIG. 1.

Each of the output signals from pulse amplifiers 51 through 57, signals $v_1$ through $v_7$, respectively, are directed into a voltage summation amplifier 72, which is depicted in detail on FIG. 4. As can be seen on FIG. 4, all seven voltage signals $v_1$ through $v_7$ are connected in parallel to a node designated by the index numeral 73, which acts as a summing junction for the voltage gain amplifier based upon transistor Q800. The summation of voltages $v_1$ through $v_7$ appears at the collector of Q800, and has the designation $v_{21}$.

All of the voltage input signals $v_1$ through $v_7$ are AC coupled through small capacitors C800 through C806, respectively, and drive into the common base amplifier based upon transistor Q800, which has a low input impedance. Voltage signal $v_{21}$ is also capacitively coupled by C809 into the negative input of voltage comparator U800, which is preferably an integrated circuit manufactured by National Semiconductor of Santa Clara, Calif., having a part number LM211. Threshold voltage $v_{36}$ is established by the +6 VDC power supply in combination with the resistor network of R807, R808, and R809. In the illustrated embodiment, the threshold voltage is approximately 100 millivolts. This comparator circuit based upon U800 also uses a certain amount of hysteresis, which is established by resisters R810 and R813.

The output of U800 is directed into a NAND gate U801, which acts as an inverter and produces a voltage $v_{22}$, which is a digital signal that is maintained at logic 0 if no light beam is touching any of the photodiodes of any of the photodiode arrays of laser light detector 50. Once enough light energy is detected by the combined photodiodes of all the photodiode arrays, the comparator U800 will change its output state, thereby forcing the NAND gate U801 into its logic 1 state. By use of the summation amplifier 72 and voltage comparator 74 (depicted in FIG. 4), laser light detector 50 looks at the total energy of all the photodiodes combined to determine the logic state of $v_{22}$. In the illustrated embodiment, the total amount of current received by all of the photodiodes has a threshold of around 10 microamperes before $v_{22}$ transitions from its logic 0 to its logic 1 state.

Figure 5:
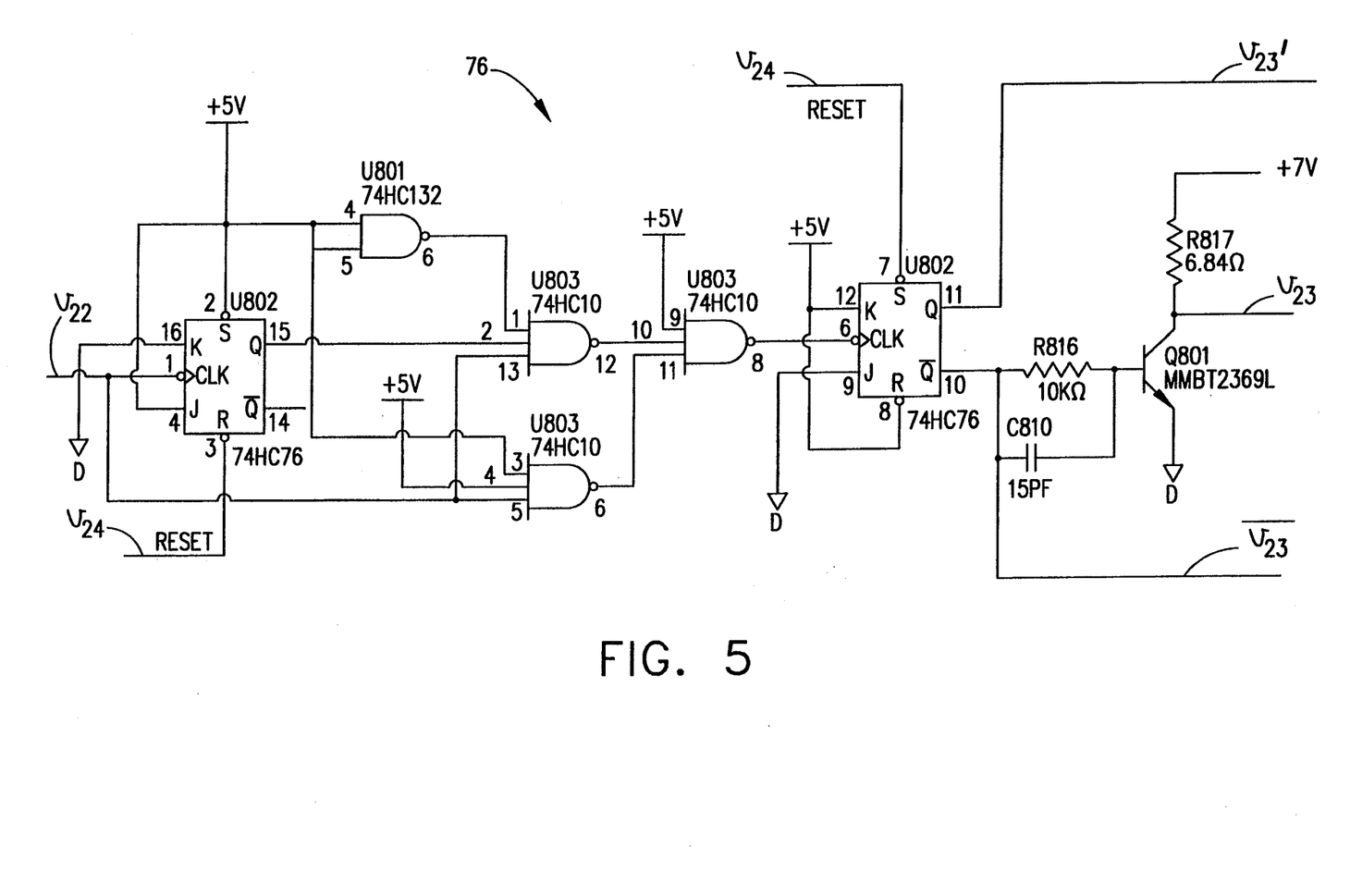
FIG. 5 is a schematic diagram of the Hold Generator circuit used in the laser light detector of FIG. 1.

The output signal of $v_{22}$ from comparator 74 is directed into a Hold Generator 76 which is depicted in detail in FIG. 5. Hold Generator 76 uses two stages of J-K flip-flops and several states of NAND gates to produce "HOLD" signals $v_{23}$ and $v_{23}'$. HOLD signal $v_{23}$ is directed back to each pulse integrator circuit 61–67, and HOLD signal $v_{23}'$ is directed to microprocessor 78. HOLD signals $v_{23}$ and $V_{23}'$ both operate in the same manner but have different voltage levels for their logic 0 and logic 1 states.

HOLD signal $v_{23}$ is a digital signal which remains in a logic 1 state while waiting for a light pulse to strike laser light detector 50. Once enough light energy is detected by the photodiodes of laser light detector 50 to force comparator output signal $v_{22}$ to change state, HOLD signal $v_{23}$ remains in its logic 1 state, until the end of the light pulse is detected, at which time it will change to its logic 0 state. This occurs when the comparator output signal $v_{22}$ drops back to its logic 0 state. The HOLD signal $v_{23}$ now remains in its logic 0 state until a "RESET" signal $v_{24}$ is received from microprocessor 78. Once this RESET signal is received, the J-K flip-flops of Hold Generator 76 are reset to their initial output states, and the HOLD signal $v_{23}$ transitions back to its logic 1 state. As depicted on FIG. 5, there is also an inverted HOLD signal which is given the designation "$v_{23}$'" on the drawings, and is also referred to as "NOT $v_{23}$". Inverted signal NOT $v_{23}$ is another digital logic signal which is always in the opposite logic state from $v_{23}$.

Figure 3:
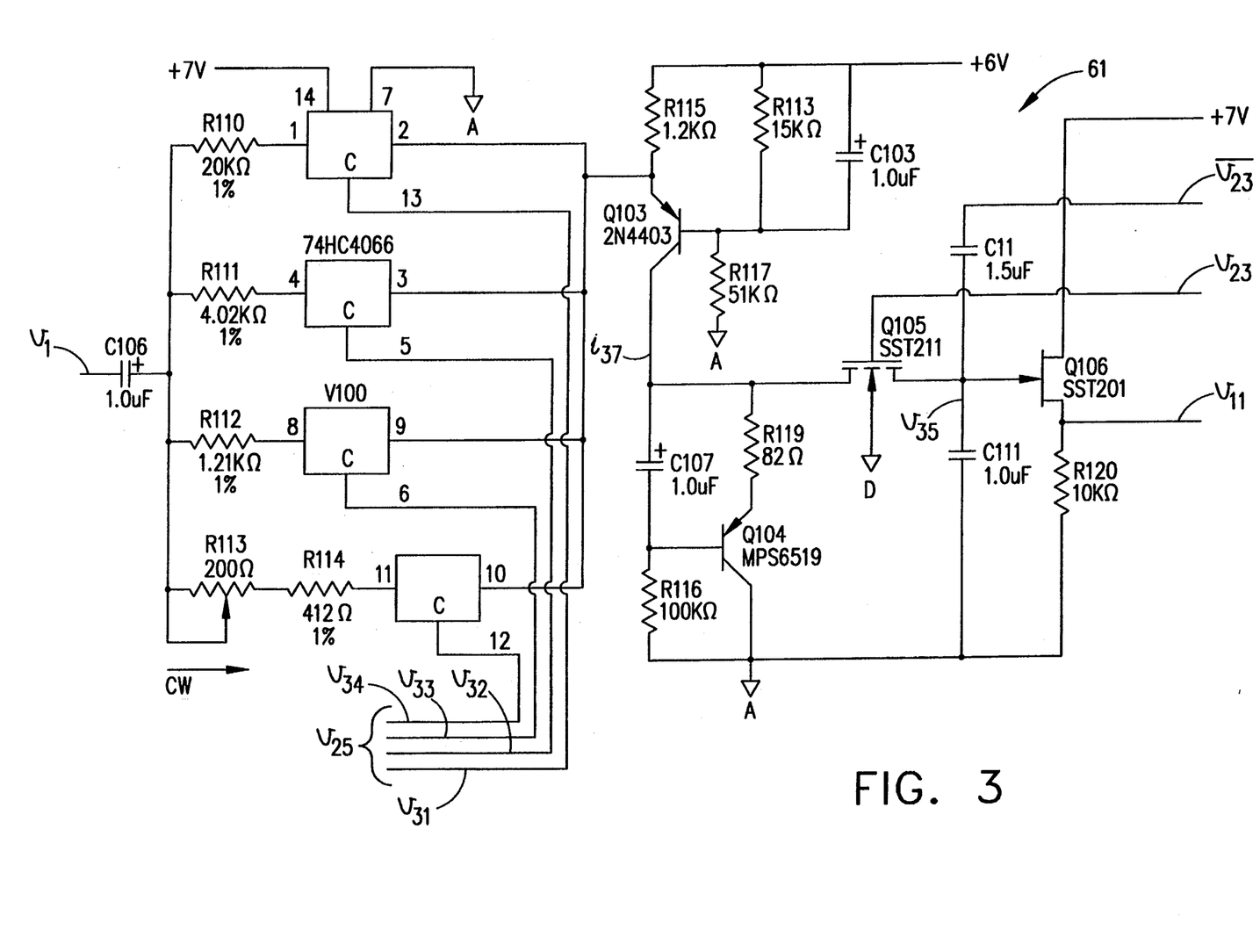
FIG. 3 is a schematic diagram of the pulse integrator and automatic gain control circuit of each input channel of the laser light detector of FIG. 1.

The operation of the pulse integrator and automatic gain control circuit 61 (for input channel 1) will now be discussed, while referring to FIG. 3. The pulse amplifier output signal $v_1$ is AC coupled into the pulse integrator and automatic control circuit 61 via capacitor C106. At this point, voltage signal $v_1$ is channelled through one of four analog switches U100, which is preferably a CMOS integrated circuit having the part number 74HC4066 (a four-channel analog switch). The use of analog switch U100 allows the gain of this circuit to be variable, by the use of four different gain resisters R110, R111, R112, and R114. As can be seen in FIG. 3, resister R114 is combined in series with a potentiometer R113, to create one in-series resistance.

Microprocessor 78 determines which of the analog switches is to be closed by use of its GAIN command signal $v_{25}$, which comprises four individual voltage signals $v_{31}$, $v_{32}$, $v_{33}$, and $v_{34}$. If the highest gain is desired, then $v_{34}$ will be placed in its logic 1 state while signals $v_{31}$ through $v_{33}$ are held in their logic 0 states. If the lowest gain is desired, then $v_{31}$ will be placed in its logic 1 state, while the other three signals are held in their logic 0 states.

In the illustrated embodiment of FIG. 3, the gain ratios are as follows: 1.0: 4.97: 16.5: 39.1. It will be understood that different gain values can be chosen depending upon the exact requirements of a given laser light detector. The method of determining which gain is to be chosen by microprocessor 78 will be discussed in detail hereinbelow.

The combination of the four various gain resisters and the four analog switches comprise the input stage for a common base amplifier that is based upon transistor Q103. This common base amplifier is a transconductance amplifier that converts a voltage signal into a current output signal, and has a high output impedance. The collector of Q103 produces a current signal having the designation $i_{37}$ which includes both the "signal" current due to light pulses striking laser light detector 50, and to "noise" current due to transient noise and solar noise that may have penetrated to this part of the circuit, and additionally includes the quiescent current.

The combination of capacitor C107, resistors R116 and R119, and transistor Q104 comprise a large inductance equivalent which shunts away any DC bias current contained in current signal $i_{37}$. Transistor Q105 is an n-channel field effect transistor (FET) which is either turned on or off by the HOLD signal $v_{23}$, which is connected to the gate input of Q105. As discussed hereinabove, the HOLD signal $v_{23}$ is at a logic 1 state while waiting for a light pulse to occur and during the light pulse's occurrence. Therefore, Q105 is turned on during the same time periods, thereby allowing the portion of current signal $i_{37}$ other than bias current to pass through the drain and source of Q105.

As current signal $i_{37}$ passes through Q105, it tends to charge capacitor C111 with a voltage having the designation $v_{35}$. JFET Q106 is a voltage follower circuit having a high input impedance and a low output impedance. Current signal $i_{37}$, which is charging capacitor C111, directly produces voltage $v_{35}$ in the same manner as a classic integrator circuit, and, therefore, when $i_{37}$ is in a positive pulse state, voltage $v_{35}$ will ramp up at a near constant slope.

During the time periods when $i_{37}$ is not in a positive pulse mode (meaning that no light input is being received by laser light detector 50), then the only signal component of $i_{37}$ is a noise component which either charges or discharges capacitor C111, depending on the instantaneous polarity of the noise. Over time, the average integration of noise equals zero, and therefore, the integrator used in this portion of laser light detector 50 provides a much greater signal-to-noise ratio then would otherwise be achieved with mere gain amplification.

Once the signal portion of $i_{37}$ starts to charge capacitor C111, a positive ramp voltage $v_{35}$ begins to ramp up at a slope determined by the magnitude of $i_{37}$. During this positive pulse, the ramping up continues as long as Q105 is turned on, which remains the case as long as the HOLD signal $v_{23}$ remains in its logic 1 state. When the light pulse is no longer detected by comparator 74, HOLD signal $v_{23}$ drops to its logic 0 state, thereby turning off transistor Q105. At this point, capacitor C111's voltage $v_{35}$ remains at its previous level for a long enough time period for its voltage to be measured by the remainder of the circuitry of laser light detector 50.

Since transistor Q106 is part of a voltage follower circuit, it produces an output voltage $v_{11}$ which is equal to voltage $v_{35}$ except for a certain bias offset voltage. The inverted voltage signal NOT $v_{23}$ is used to partially correct the charge which is drawn from C114 through the gate-channel capacitance of Q105 when $v_{23}$ changes state. Since $v_{35}$ is held at a constant voltage after the light pulse disappears, similarly so does voltage $v_{11}$, which is directed to the input of A/D converter 70. Noting the fact that all seven input channels of the illustrated embodiment of laser light detector 50 are simultaneously sending such voltage signals $v_{11}$ through $v_{17}$ to A/D converter 70, it can be thus seen that microprocessor 78 can determine the precise voltage level of each of the input channels of the photodiode arrays by sequentially sampling the output voltage $v_{20}$ of A/D converter 70.

Since the time duration that a light pulse is received by the photodiode array of laser light detector 50 is variable, depending upon the distance laser light detector 50 is located from the rotating laser light source, it is important that the voltage signal $v_{35}$ does not saturate as capacitor C111 is charged. The automatic gain control circuit portion of FIG. 3 is used to precisely avoid this problem, under the control of microprocessor 78. Since the gain can be easily controlled in this manner, the pulse integrator and automatic gain control circuit 61 can accommodate a very large pulse width range, typically from as little as 0.5 microseconds to as much as 0.5 milliseconds. By use of this circuit, the dynamic range of the pulse integrator and automatic gain control circuit 61 is at least 30,000 to 1. This is a distinct advantage over any of the prior art, particularly in view of the fact that the signal-to-noise ratio of laser light detector 50 is greatly improved over the prior art circuits.

The functions of microprocessor 78 will now be discussed in detail. As related hereinabove, microprocessor 78 receives a HOLD signal $v_{23}'$ at the end of each received light pulse. After this occurs, microprocessor 78 reads the output of A/D converter 70 (voltage signal $v_{20}$) while scanning through all seven input channels of the illustrated embodiment. After scanning all seven input channels, microprocessor 78 stores the A/D converter information for each of the channels. Based upon the numeric values of each of the input channels, microprocessor 78 calculates a numeric position value which is related to the beam strike position upon any one of the photodiode arrays 94, 96, 98 or 100. After microprocessor 78 calculates the numeric position value, it resets the Hold Generator by outputting a RESET signal $v_{24}$. This sequence of events occurs after laser light detector 50 starts to receive light signals from a rotating laser light source.

When laser light detector 50 is first turned on, and before it starts to receive any laser light signals, microprocessor 78 performs the following initialization functions:

(1) The circuit defaults to the highest gain state, meaning that the high gain command $v_{34}$ is activated to close the analog switch will allow current to pass through resistor R114.

(2) Microprocessor 78 periodically samples the output of all seven input channels from A/D converter 70. The numeric value of each of these seven input channels is then stored in RAM, which allows microprocessor 78 to keep track of the quiescent bias voltage of the integrator circuits 61–67 of each of the input channels.

(3) Microprocessor 78 controls LED display 80, via signals $v_{26}$, such that no information about the present elevation is displayed on that LED display. During the time that light pulses are received by laser light detector 50, LED display 80 will always display some type of elevation indication, so that the equipment operator can ascertain the present elevation as compared to the rotating plane of laser light.

Once the first light beam strikes one of the photodiode arrays 94, 96, 98 or 100, the HOLD signal becomes active (at the end of the light pulse), and microprocessor 78 immediately samples all seven input channels using A/D converter 70. Each channel is received as a numeric value, and the previous quiescent bias level of each channel (which was previously stored in RAM) is subtracted from the new numeric value received from A/D converter 70. This subtraction results in a new net numeric value for each of the input channels, which is used in a "position" calculation, by use of the following preferred equation:

$$R = \frac{K_1 CH_1 + K_2 CH_2 + K_3 CH_3 + K_4 CH_4 + K_5 CH_5 + K_6 CH_6 + K_7 CH_7}{CH_1 + CH_2 + CH_3 + CH_4 + CH_5 + CH_6 + CH_7};$$

Where $CH_x$ = the net numeric A/D converter value, per input channel;

R = a numeric position result, in the range of $0-1FF_{16}$;

$K_x$ = constants which are stored in microprocessor 78.

The above equation calculates a weighted average in which the various constants $K_x$ can be given values that provide a purely linear result, or can provide a different (non-linear) result depending on which options are chosen by the equipment set-up operator. In the illustrated embodiment, constants $K_x$ can be chosen as follows:

$K_1=0$, $K_2=55_{16}$, $K_3=AA_{16}$, $K_4=FF_{16}$, $K_5=155_{16}$, $K_6=1AA_{16}$, $K_7=1FF_{16}$

As can be seen from the above equation and values for constants $K_x$, the minimum numeric value for the position result R is $0_{16}$, and the maximum value is $1FF_{16}$. The various options can affect the way the results are interpreted, which will be discussed in detail hereinbelow. It will be understood that a different equation could be used to calculate a numeric result other than a weighted average without departing from the principles of the present invention.

After the position calculation has taken place, the calculated position R of the laser light strike will be indicated on LED display 80. This position, however, will probably not be accurate if at least one of the input channels of the A/D converter 70 is saturated. Since the highest gain state is chosen before the first beam strike occurs, it will be quite likely that at least one of these input channels will be saturated.

More accurate data can be displayed after the next laser light strike, using the following procedure: after each of the laser light strikes occurs, microprocessor 78 scans the stored data for each of the A/D channels to determine the maximum numeric value of any one channel, which will be given the designation "X" for this discussion. Since the preferred A/D converter 70 is a 10-bit A/D converter, its numeric output is in the range of $0-1023_{10}$. "Y" is a fixed number in memory (in the computer program stored in ROM) which is just less than the maximum possible number of $1023_{10}$. If X is greater than Y, then microprocessor 78 will reduce the gain state by one step, if possible. Of course, if laser light detector 50 is already at its minimum gain state, then the input circuits will have to continue operating while one or more of the input channels is in a saturated state.

"W" is another fixed number stored in memory (ROM) which is just greater than the minimum possible output value of zero (0) from A/D converter 70. If X is less than W, then microprocessor 78 will increase the gain state by one, if possible. Again, if it is not possible to increase the gain state by one (i.e., laser light detector 50 is already operating at its maximum gain state), then laser light detector 50 will have to continue operating using data which is very low in voltage level.

Any change in gain state, if it occurs, will take place much in advance of the next expected light strike of the photodiode arrays of laser light detector 50. Since most rotating laser light sources operate at 600 rpm, there is typically one hundred milliseconds of time between the expected light pulse receptions.

A keypad 84 is used to choose the various options available in laser light detector 50, using signals $v_{28}$ that are received by microprocessor 78. Keypad 84 is active both before and during light pulse detection by laser light detector 50. In other words, the options can be changeable while the circuit is operating and displaying the present elevation. One available option is the adjustment of the dead band, or accuracy, in which fine, wide, and extra wide dead bands are available. In the fine mode, the dead band is one-quarter inch ($\pm\frac{1}{8}''$); the wide dead band is one inch ($\pm\frac{1}{2}''$); and the extra wide dead band is two inches ($\pm 1''$). This adjustment allows the equipment operator to fine tune the overall accuracy and precision of laser light detector 50 if desired, or to reduce that precision if desirable.

Another option available in the illustrated embodiment is the use of either a normal or offset "on-grade" zone of the photodiode arrays of laser light detector 50. The on-grade zone can be either located in the center, or can be offset from center, depending upon the application being performed by the piece of equipment that laser light detector 50 is attached to. For example, if laser light detector 50 is attached to an excavator or backhoe (devices having a shovel), the "offset" on-grade mode will provide more warning if the equipment is above-grade.

Use of the offset on-grade mode moves the center line of the photodiode array (e.g., array 94 or 96) to a higher position on laser light detector 50, and the "on-grade" indication on LED display 80 is correspondingly lowered to below the center line of that display. This allows LED display 80 to show more discrete stages of above-grade, which is important when using the shovel. One way of accomplishing this is to change the constants $K_x$ in determining the numeric value of the position result R. Alternatively, the discrete elevations of grade information can be changed, examples of which are given below. For example, a standard "center on-grade zone", having seven discrete elevations, would have a preferred set of values as follows:

| Elevation Designation | Inches | CENTER NORMAL Numeric Value in Hexadecimal (0-1FF) | Percent (0-100) |
| --- | --- | --- | --- |
| Course High | 8.00 to 6.19 | 000-02A | 0.0-8.2 |
| Medium High | 6.18 to 5.35 | 02B-07F | 8.4-24.8 |
| Fine High | 5.34 to 4.71 | 080-0B0 | 25.0-34.4 |
| On Grade | 4.70 to 4.35 | 0B1-0F0 | 34.6-47.0 |
| Fine Low | 4.34 to 3.65 | 0F1-12A | 47.2-55.2 |
| Medium Low | 3.64 to 2.78 | 17F-12B | 58.5-74.9 |
| Course Low | 2.77 to 0.00 | 180-1FF | 75.1-100.0 |

In another example, the "offset on-grade zone" values preferably would be as follows:

| Elevation Designation | Inches | OFFSET NORMAL Numeric Value in Hexadecimal (0-1FF) | Percent (0-100) |
| --- | --- | --- | --- |
| Course High | 8.00 to 6.38 | 000-005 | 0.0-1.0 |
| Medium High 2 | 6.37 to 5.34 | 006-07F | 1.2-24.8 |
| Medium High 1 | 5.33 to 3.84 | 080-0FF | 25.0-49.9 |
| Fine High 2 | 3.83 to 2.79 | 100-17F | 50.1-74.9 |
| Fine High 1 | 2.78 to 2.13 | 180-1B7 | 75.1-85.9 |
| On Grade | 2.12 to 1.76 | 1B8-1F7 | 86.1-98.4 |
| Low | 1.75 to 0.00 | 1F8-1FF | 98.6-100.0 |

Since the calculated position value for the elevation signal to be indicated on LED display 80 has the precision of $0-1FF_{16}$ ($0-511_{10}$), the illustrated embodiment of laser light detector 50 is not limited to a mere seven discrete elevation designations to be displayed on LED display 80. Using a normal "center on-grade zone", a much greater range of discrete elevations could be displayed, for example, having five high elevations and five low elevations in addition to the on-grade elevation. This can be illustrated in the following table:

| Elevation Designation | Inches | CENTER HIGH-RESOLUTION Numeric Value in Hexadecimal (0-1FF) | Percent (0-100) |
| --- | --- | --- | --- |
| Course High | 8.00 to 7.28 | 000-02E | 0.00-9.09 |
| Medium High 2 | 7.27 to 6.56 | 02F-05C | 9.09-18.2 |
| Medium High 1 | 6.55 to 5.83 | 05D-08B | 18.2-27.3 |
| Fine High 2 | 5.82 to 5.10 | 08C-0B9 | 27.3-36.4 |

-continued

| CENTER HIGH-RESOLUTION | | | |
| --- | --- | --- | --- |
| Elevation Designation | Inches | Numeric Value in Hexadecimal (0-1FF) | Percent (0-100) |
| Fine High 1 | 5.09 to 4.37 | 0BA-0E7 | 36.4-45.4 |
| On-grade | 4.36 to 3.65 | 0E8-116 | 45.4-54.5 |
| Fine Low 1 | 3.64 to 2.92 | 117-144 | 54.5-63.6 |
| Fine Low 2 | 2.91 to 2.19 | 145-173 | 63.6-72.7 |
| Medium Low 1 | 2.18 to 1.46 | 174-1A1 | 72.7-81.8 |
| Medium Low 2 | 1.45 to 0.74 | 1A2-1D0 | 81.8-90.9 |
| Course Low | 0.73 to 0.00 | 1D1-1FF | 90.9-100.0 |

Another option that can be utilized in laser light detector 50 is the "averaging" option. The averaging option is useful if laser light detector 50 is located at a relatively large distance from the rotating laser light source. In such a situation, the laser light beam will tend to bounce up and down due to atmospheric effects, and/or due to the light transmitter's beam being not perfectly stable. In view of this, the equipment set-up operator can use keypad 84 to change the averaging mode as follows: (1) display value after one laser light strike (no average being calculated); (2) display elevation after two sequential strikes; or (3) display elevation after four sequential strikes. The algorithm utilized by microprocessor 78 calculates a rolling average after each new laser light strike, once the first two or four strikes have occurred. In other words, if the "four" option for the averaging has been chosen by the set-up operator, the initial elevation will not be displayed until the first four strikes have occurred. However, once four light beam strikes have occurred, the elevation will be indicated and updated on LED display 80 after each new strike has occurred, using the most recent four strikes and averaging those four values to arrive at a single "averaged" position value.

Another option of laser light detector 50 is the "lock-out" option. This option allows the equipment set-up operator to lock-out all of the keys of keypad 84 once the initial set-up has taken place. This disables keypad 84 such that no other person can come along and change any of the options, and even prevents the laser light detector 50 from being turned off. A special set of keys must be simultaneously pressed to either enter or exit this lock-out mode.

The status of each of these options is displayed on liquid crystal display 82, which is controlled by microprocessor 78 via signals $v_{27}$.

Laser light detector 50 can be optionally equipped with other output devices. For example, an infrared transmitter 86 can be installed on laser light detector 50 to transmit the numeric value of the present position elevation detected by laser light detector 50. Microprocessor 78 controls infrared transmitter 86 via signals $v_{29}$. In addition, an external connector may be used to connect signal wires up to a remote LED display 88, which displays the same elevation information as displayed on LED display 80. Microprocessor 78 controls such remote LED display 88 via signals $v_{30}$.

It will be understood that the above-described options are merely examples of some of the features that can be provided for laser light detector 50. Many other options can be added to the circuit of laser light detector 50 without departing from the principles taught by the present invention.

As is common in electronic circuits, a multi-voltage DC power supply 90 is provided with laser light detector 50. This DC power supply can be hooked into the battery 92 of the equipment that laser light detector 50 is attached to. If a cable-less installation is desired, then DC power supply 90 can run on its own internal batteries.

The foregoing description of a preferred embodiment of the invention has been presented for purposes of illustration and description. It is not intended to be exhaustive or to limit the invention to the precise form disclosed. Obvious modifications or variations are possible in light of the above teachings. The embodiment was chosen and described in order to best illustrate the principles of the invention and its practical application to thereby enable one of ordinary skill in the art to best utilize the invention in various embodiments and with various modifications as are suited to the particular use contemplated. It is intended that the scope of the invention be defined by the claims appended hereto.

I claim:

1. A light detecting circuit, comprising:
   (a) means for detecting pulses of light energy striking said light detecting circuit, wherein said means for detecting pulses of light energy includes a plurality of light-sensitive elements arranged in an array, thereby creating a plurality of first electrical signals, wherein the magnitude of each of said plurality of first electrical signals is proportional to the power of light striking its corresponding light-sensitive element;
   (b) means for amplifying and integrating each of said plurality of first electrical signals, thereby creating a plurality of second electrical signals, wherein the gain of said means for amplifying and integrating each of said plurality of first electrical signals is automatically controlled so as to keep said plurality of second electrical signals within the active dynamic range of said light detecting circuit, and wherein the peak magnitude of each of said plurality of second electrical signals is proportional to the power and to the duration time of light striking its corresponding light-sensitive element;
   (c) means for converting each of said plurality of second electrical signals into corresponding numeric values, thereby creating a first plurality of numeric values, each of which is proportional to the magnitude of its corresponding individual signal of said plurality of second electrical signals;
   (d) means for calculating, from said first plurality of numeric values, a second numeric value indicative of the physical location that substantially the center of said light energy is striking said array of light-sensitive elements;
   (e) means for converting said second numeric value into a corresponding discrete location indicative of the actual physical location, in comparison to the desired physical location, that substantially the center of said light energy is striking said array of light-sensitive elements; and
   (f) means for displaying said discrete location.

2. The light detecting circuit as recited in claim 1, further comprising means for summing each of said plurality of first electrical signals, thereby creating a third electrical signal which, if its magnitude is greater than a predetermined threshold, is indicative that said light detecting circuit is presently receiving a light signal of sufficient energy, and thereupon, commanding said light detecting circuit to calculate an updated discrete location.

3. The light detecting circuit as recited in claim 2, wherein the received light signals are detected as light pulses which occur at periodic intervals.

4. The light detecting circuit as recited in claim 1, further comprising means for compensating for quiescent conditions when creating said first plurality of numeric values.

5. The light detecting circuit as recited in claim 1, wherein said plurality of light-sensitive elements comprises a plurality of photodiodes.

6. The light detecting circuit as recited in claim 1, wherein said plurality of light-sensitive elements are arranged in a substantially linear array.

7. The light detecting circuit as recited in claim 1, wherein the automatically controlled gain of said means for amplifying and integrating each of said plurality of first electrical signals comprises a plurality of resistors and analog switches controlled by a computer program and a means for processing that computer program.

8. The light detecting circuit as recited in claim 1, wherein the integrator portion of said means for amplifying and integrating each of said plurality of first electrical signals comprises an analog signal current source driving into a capacitor.

9. The light detecting circuit as recited in claim 1, wherein said means for converting each of said plurality of second electrical signals into corresponding numeric values comprises an analog-to-digital converter.

10. The light detecting circuit as recited in claim 1, wherein said means for calculating said second numeric value comprises a means for processing which is controlled by a computer program.

11. The light detecting circuit as recited in claim 1, wherein said means for calculating said second numeric value produces a weighted average of said first plurality of numeric values.

12. The light detecting circuit as recited in claim 1, wherein said means for displaying said discrete location comprises an LED display.

13. A method for detecting the position of received light, comprising the steps of:
   (a) providing a light detecting circuit;
   (b) detecting pulses of light energy striking said light detecting circuit, using a plurality of light-sensitive elements arranged in an array, thereby creating a plurality of first electrical signals, wherein the magnitude of each of said plurality of first electrical signals is proportional to the power of light striking its corresponding light-sensitive element;
   (c) amplifying and integrating each of said plurality of first electrical signals, thereby creating a plurality of second electrical signals, wherein the gain of said means for amplifying and integrating each of said plurality of first electrical signals is automatically controlled so as to keep said plurality of second electrical signals within the active dynamic range of said light detecting circuit, and wherein the peak magnitude of each of said plurality of second electrical signals is proportional to the power and to the duration time of light striking its corresponding light-sensitive element;
   (d) converting each of said plurality of second electrical signals into corresponding numeric values, thereby creating a first plurality of numeric values, each of which is proportional to the magnitude of its corresponding individual signal of said plurality of second electrical signals;
   (e) calculating, from said first plurality of numeric values, a second numeric value indicative of the physical location that substantially the center of said light energy is striking said array of light-sensitive elements;
   (f) converting said second numeric value into a corresponding discrete location indicative of the actual physical location, in comparison to the desired physical location, that substantially the center of said light energy is striking said array of light-sensitive elements; and
   (g) displaying said discrete location.

14. The method as recited in claim 13, further comprising the step of summing each of said plurality of first electrical signals, thereby creating a third electrical signal which, if its magnitude is greater than a predetermined threshold, is indicative that said light detecting circuit is presently receiving a light signal of sufficient energy, and thereupon, commanding said light detecting circuit to calculate an updated discrete location.

15. The method as recited in claim 13, further comprising the step of compensating for quiescent conditions by sampling said first plurality of numeric values at time intervals when the received light consists solely of ambient light, thereby creating a third plurality of numeric values, then sampling said first plurality of numeric values at time intervals when the received light comprises both ambient light and a directed light beam emanating from a light source, thereby creating a fourth plurality of numeric values, then subtracting said corresponding third numeric values from said fourth numeric values, respectively, to derive a plurality of compensated numeric values.

16. The method as recited in claim 13, wherein the step of calculating said second numeric value produces a weighted average of said first plurality of numeric values, which is indicative of the physical location that substantially the center of said light energy is striking said array of light-sensitive elements.

17. A light detecting circuit, comprising:
   (a) an enclosure having a plurality of light-sensitive elements, each arranged in an array, wherein each light-sensitive element creates a first electrical signal that is proportional to the power of light striking the element, thereby creating a plurality of first electrical signals;
   (b) an amplifier, integrator, and hold circuit for each of said plurality of first electrical signals, including automatic gain control of the amplifier to keep the output signal of the integrator within the active dynamic range of said light detecting circuit, wherein said output signal has its peak magnitude maintained for a predetermined time interval by said hold circuit, and wherein said peak magnitude is proportional to the power and to the duration time of light striking its corresponding light-sensitive element, thereby creating a plurality of second electrical signals;
   (c) an analog-to-digital converter which converts each of said second electrical signals into a numeric value, thereby creating a first plurality of numeric values, each of which is proportional to the magnitude of its corresponding individual signal of said plurality of second electrical signals;
   (d) means for processing a computer program which calculates, from said first plurality of numeric values, a second numeric value indicative of the physical location that substantially the center of said light energy is striking said array of light-sensitive elements;

(e) means for processing a computer program which converts said second numeric value into a corresponding discrete location indicative of the actual physical location, in comparison to the desired physical location, that substantially the center of said light energy is striking said array of light-sensitive elements; and (f) a display.

18. A light detecting circuit recited in claim 17, further comprising a voltage summing amplifier which sums each of said plurality of first electrical signals, thereby creating a third electrical signal which, if its magnitude is greater than a predetermined threshold, is indicative that said light detecting circuit is presently receiving a light signal of sufficient energy, and thereupon, commanding said light detecting circuit to calculate an updated discrete location.

19. A light detecting circuit recited in claim 17, wherein said enclosure includes a plurality of arrays, each comprising a plurality of light-sensitive elements, having a configuration to detect a beam of light striking said enclosure from any angle.

20. The light detecting circuit as recited in claim 17, further comprising means for compensating for quiescent conditions when creating said first plurality of numeric values.

21. The light detecting circuit as recited in claim 17, wherein said plurality of light-sensitive elements are arranged in a substantially linear array.

22. The light detecting circuit as recited in claim 17, wherein said means for processing a computer program which calculates a second numeric value produces a weighted average of said first plurality of numeric values.

* * * * *